United States Patent
Lin et al.

(10) Patent No.: US 9,191,006 B1
(45) Date of Patent: Nov. 17, 2015

(54) CURRENT-LIMITED LEVEL SHIFT CIRCUIT

(71) Applicant: ILI TECHNOLOGY CORP., Hsinchu County (TW)

(72) Inventors: Ren-Yi Lin, Pingtung County (TW); Chun-Ku Lin, Hsinchu (TW)

(73) Assignee: ILI TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 14/478,435

(22) Filed: Sep. 5, 2014

(30) Foreign Application Priority Data

Jun. 18, 2014 (TW) .............................. 103121079 A (51) Int. Cl.
    *H03L 5/00* (2006.01)
    *H03K 19/0175* (2006.01)
(52) U.S. Cl.
    CPC .............................. *H03K 19/017509* (2013.01)
(58) Field of Classification Search
    None
    See application file for complete search history.

(56) References Cited

U.S. PATENT DOCUMENTS

2013/0162294 A1* 6/2013 Henmi ........... H03K 19/018507
                                                326/80
2014/0266386 A1* 9/2014 Huang ............... H03K 3/35613
                                                327/333

* cited by examiner

*Primary Examiner* — Long Nguyen
(74) *Attorney, Agent, or Firm* — Li & Cai Intellectual Property (USA) Office (57) ABSTRACT

A current-limited level shift circuit comprises a first PMOS transistor, a second PMOS transistor, a third PMOS transistor, a fourth PMOS transistor, a first current-limiting unit, a second current-limiting unit, a first NMOS transistor and a second NMOS transistor, for providing a pair of input terminals and three pairs of output terminals outputting level shift signals. The first current-limiting unit is connected between the third output terminal and the fifth output terminal, and the second current-limiting unit is connected between the fourth output terminal and the sixth output terminal, for providing the current limiting of state transition. The pair of the first output terminal and the second output terminal, the pair of the third output terminal and the fourth output terminal, and the pair of the fifth output terminal and the sixth output terminal are selectively for providing multiple choices to the second stage.

9 Claims, 9 Drawing Sheets

CURRENT-LIMITED LEVEL SHIFT CIRCUIT

BACKGROUND OF THE INVENTION

1. Field of the Invention

The instant disclosure relates to a level shift circuit; in particular, to a current-limited level shift circuit having multiple output terminals.

2. Description of Related Art

Figure 1:
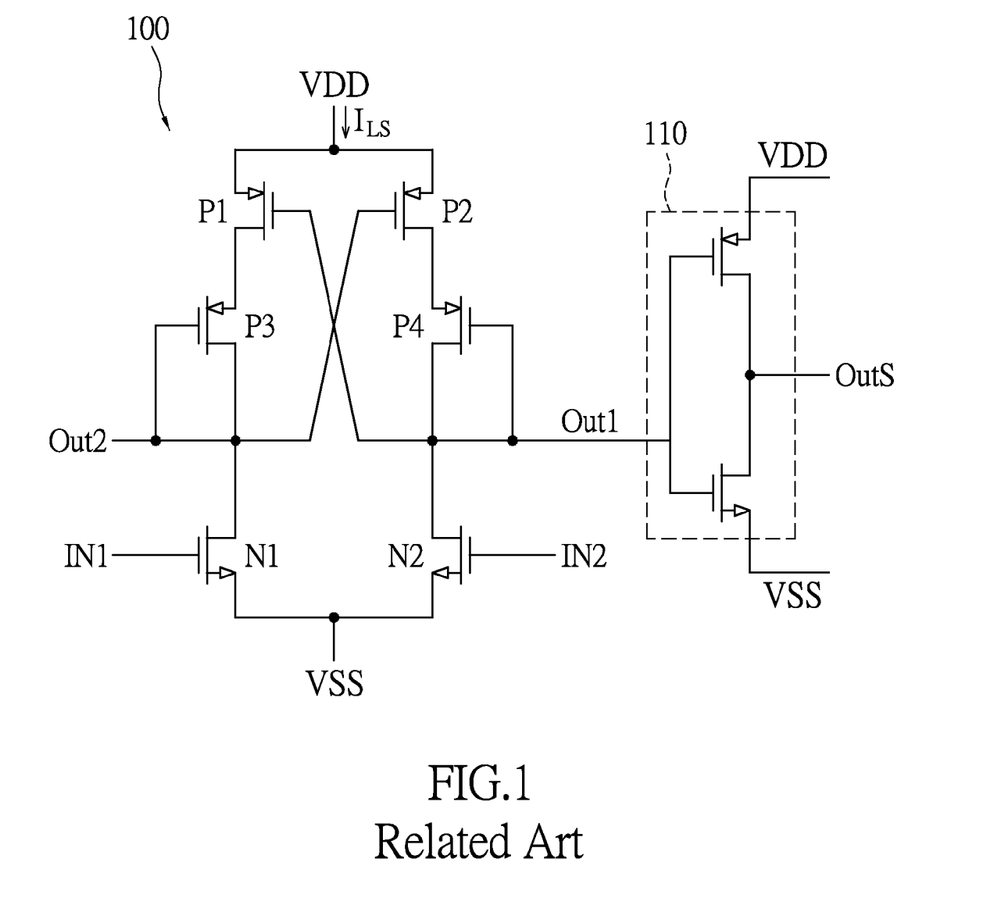
FIG. 1 shows a circuit diagram of a conventional level shift circuit.

Please refer to FIG. 1 showing a circuit diagram of a conventional level shift circuit. The conventional level shift circuit 1 has a first PMOS transistor, a second PMOS transistor, a third PMOS transistor, a fourth PMOS transistor, a first NMOS transistor and a second NMOS transistor. The conventional level shift circuit 1 converts the signal from the first input terminal IN1 and the second input terminal IN2 to the signal at the output terminal Out2 and the output terminal Out1. In FIG. 1, the output terminal Out1 is connected to the input terminal of the CMOS inverter 110, wherein the CMOS inverter 110 is a second stage circuit, and the output terminal of the CMOS inverter is the second stage output terminal OutS, in which the second stage output terminal OutS generates the signal which is inverted of the signal of the output terminal Out1.

However, large current generated by the conventional level shift circuit 1 during the state transition usually increases the power consumption of the circuit. And, the conventional level shift circuit 1 only has the one to one corresponding output terminals Out1 and Out2 which only provide single type of output signal, thus the conventional level shift circuit 1 has very limited applications. Therefore, it is still needed to improve the conventional level shift circuit 1.

SUMMARY OF THE INVENTION

The object of the instant disclosure is to provide a current-limited level shift circuit, for providing level shift signal with one pair of input terminals and three pairs of output terminals.

In order to achieve the aforementioned objects, according to an embodiment of the instant disclosure, a current-limited level shift circuit is provided. The current-limited level shift circuit comprises a first PMOS transistor, a second PMOS transistor, a third PMOS transistor, a fourth PMOS transistor, a first current-limiting unit, a second current-limiting unit, a first NMOS transistor, and a second NMOS transistor. A source of the first PMOS transistor is connected to a first voltage level. A drain of the first PMOS transistor is connected to a first output terminal. A source of the second PMOS transistor is connected to the first voltage level. A drain of the second PMOS transistor is connected to a second output terminal, wherein the first output terminal and the second output terminal are in pairs. A source of the third PMOS transistor is connected to the drain of the first PMOS transistor. A drain of the third PMOS transistor is connected to a third output terminal. A source of the fourth PMOS transistor is connected to the drain of the second PMOS transistor. A drain of the fourth PMOS transistor is connected to a fourth output terminal, wherein the third output terminal and the fourth output terminal are in pairs. A first terminal of the first current-limiting unit is connected to the drain of the third PMOS transistor. A first terminal of the second current-limiting unit is connected to the drain of the fourth PMOS transistor. A source of the first NMOS transistor is connected to a second voltage level. A gate of the first NMOS transistor is connected to a first input terminal. A drain of the first NMOS transistor is connected to a fifth output terminal and a second terminal of the first current-limiting unit. A source of the second NMOS transistor is connected to the second voltage level. A gate of the second NMOS transistor is connected to a second input terminal. A drain of the second NMOS transistor is connected to a sixth output terminal and a second terminal of the second current-limiting unit, wherein the fifth output terminal and the sixth output terminal are in pairs. A gate of the first PMOS transistor and a gate of the second PMOS transistor are respectively connected to the pair of the fourth output terminal and the third output terminal or the pair of the sixth output terminal and the fifth output terminal, a gate of the third PMOS transistor and a gate of the fourth PMOS transistor are respectively connected to the pair of the third output terminal and the fourth output terminal or the pair of the fifth output terminal and the sixth output terminal. The pair of the first output terminal and the second output terminal, the pair of the third output terminal and the fourth output terminal, and the pair of the fifth output terminal and the sixth output terminal are for selectively connecting to a second stage circuit.

In summary, a current-limited level shift circuit is provided. The first current-limiting unit of the provided current-limited level shift circuit is connected between the third output terminal and the fifth output terminal, and the second current-limiting unit of the provided current-limited level shift circuit is connected between the fourth output terminal and the sixth output terminal, thus the provided current-limited level shift circuit can provide current limiting during the state transition. Additionally, multiple pairs of output terminals or multiple output terminals of the provided current-limited level shift circuit provide a plurality of input selections for the second stage circuit.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Embodiments of the Current-Limited Level Shift Circuit

Figure 2:
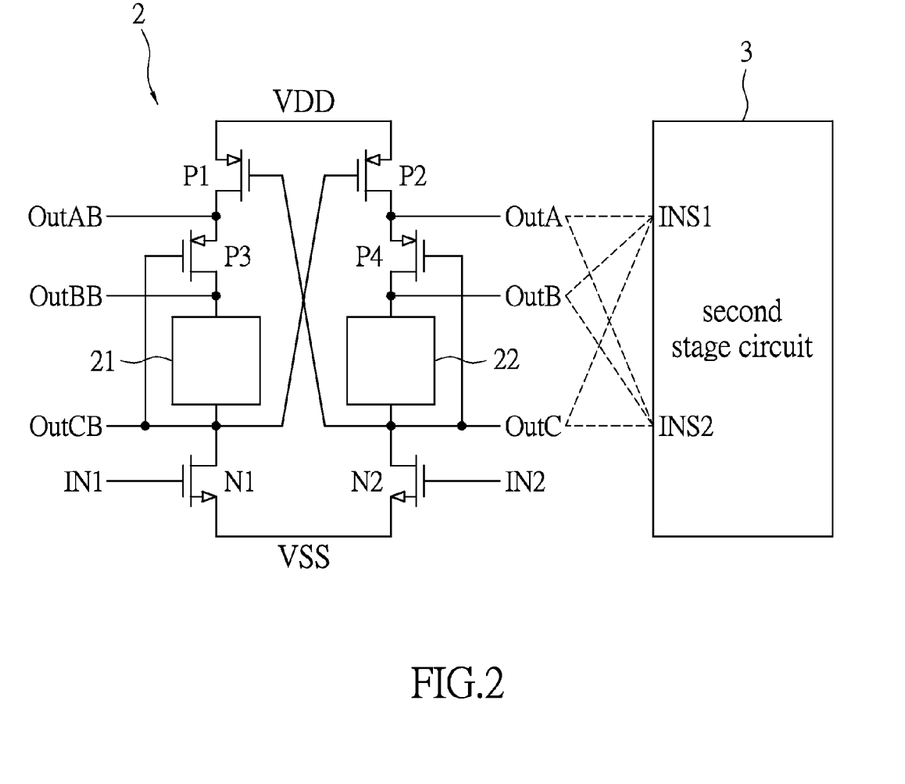
FIG. 2 shows a circuit diagram of a current-limited level shift circuit according to an embodiment of the instant disclosure.

The current-limited level shift circuit provided in this embodiment can limit the current during the state transition, for reducing the power consumption. One pair of input terminals and three pairs of output terminals for the level shift signal are provided. In order to describe the instant disclosure in an understandable and clear way, please refer to FIG. 2 showing a circuit diagram of a current-limited level shift circuit according to an embodiment of the instant disclosure. However, the current-limited level shift circuit of the instant disclosure is not limited to the circuit of FIG. 2, and other embodiments of the current-limited level shift circuit are further described in subsequent FIG. 3B, FIG. 3C, and FIG. 3D.

The current-limited level shift circuit 2 comprises a first PMOS transistor P1, a second PMOS transistor P2, a third PMOS transistor P3, a fourth PMOS transistor P4, a first current-limiting unit 21, a second current-limiting unit 22, a first NMOS transistor N1, and a second NMOS transistor N2. The current-limited level shift circuit 2 has two input terminals which are a first input terminal IN1 and a second input terminal IN2. The first input terminal IN1 is for inputting a first input signal, and the second input terminal IN2 is for inputting a second input signal, in which the second input signal is the inverted signal of the first input signal. The current-limited level shift circuit 2 has three pairs of output terminals, for providing a high voltage (HIGH) about a first voltage level VDD, and for providing a low voltage (LOW) about a second voltage level VSS. The output terminals of the current-limited level shift circuit 2 are a first output terminal OutAB and a second output terminal OutA in pairs, a third output terminal OutBB and a fourth output terminal OutB in pairs, and a fifth output terminal OutCB and a sixth output terminal OutC in pairs. For the voltage of the input signal, the first input signal and the second input signal both have two voltage levels, respectively are a third voltage level VIN and the second voltage level VSS, wherein the third voltage level VIN is lower than the first voltage level VDD, and the second voltage level VSS is lower than the third voltage level VIN.

A source of the first PMOS transistor P1 is connected to the first voltage level VDD. A drain of the first PMOS transistor P1 is connected to the first output terminal OutAB. A source of the second PMOS transistor P2 is connected to the first voltage level VDD. A drain of the second PMOS transistor P2 is connected to the second output terminal OutA, wherein the first output terminal OutAB and the second output terminal OutA are in pairs. A source of the third PMOS transistor P3 is connected to the drain of the first PMOS transistor P1. A drain of the third PMOS transistor P3 is connected to the third output terminal OutBB. A source of the fourth PMOS transistor P4 is connected to the drain of the second PMOS transistor P2. A drain of the fourth POMS transistor P4 is connected to the fourth output terminal OutB, wherein the third output terminal OutBB and the fourth output terminal OutB are in pairs. The first current-limiting unit 21 has two terminals. A first terminal of the first current-limiting unit 21 is connected to the drain of the third PMOS transistor P3. The second current-limiting unit 22 has two terminals. A first terminal of the second current-limiting unit 22 is connected to the drain of the fourth PMOS transistor P4. A source of the first NMOS transistor N1 is connected to the second voltage level VSS. A gate of the first NMOS transistor N1 is connected to the first input terminal IN1. A drain of the first NMOS transistor N1 is connected to the fifth output terminal OutCB and a second terminal of the first current-limiting unit 21. A source of the second NMOS transistor N2 is connected to the second voltage level VSS. A gate of the second NMOS transistor N2 is connected to the second input terminal IN2. A drain of the second NMOS N2 transistor is connected to the sixth output terminal OutC and a second terminal of the second current-limiting unit 22, wherein the fifth output terminal OutCB and the sixth output terminal OutC are in pairs.

Furthermore, as shown in FIG. 2, a gate of the first PMOS transistor P1 and a gate of the second PMOS transistor P2 are respectively connected to the pair of the sixth output terminal OutC and the fifth output terminal OutCB, a gate of the third PMOS transistor P3 and a gate of the fourth PMOS transistor P4 are respectively connected to the pair of the fifth output terminal OutCB and the sixth output terminal OutC, but the instant disclosure is not so restricted. Specifically, in order to adjust the voltage level of the output terminals, the gate of the first PMOS transistor P1 and the gate of the second PMOS transistor P2 are respectively connected to the pair of the fourth output terminal OutB and the third output terminal OutBB or the pair of the sixth output terminal OutC and the fifth output terminal OutCB, and the gate of the third PMOS transistor P3 and the gate of the fourth PMOS transistor P4 are respectively connected to the pair of the third output terminal OutBB and the fourth output terminal OutB or the pair of the fifth output terminal OutCB and the sixth output terminal OutCB. Other embodiments are referred to in the descriptions of FIG. 3A, FIG. 3B, FIG. 3C and FIG. 3D thereafter.

The pair of the first output terminal OutAB and the second output terminal OutA, the pair of the third output terminal OutBB and the fourth output terminal OutB, and the pair of the fifth output terminal OutCB and the sixth output terminal OutC are for selectively connecting to a second stage circuit 3. The mentioned second stage circuit may be a logic circuit or a digital circuit. The second stage circuit can be an operational amplifier (OP), a comparator, an inverter or the current-limited level shift circuit of this embodiment (that is a type of a level shift circuit). Regarding the circuit shown in FIG. 2, for example, the second output terminal OutA, the fourth output terminal OutB and the sixth output terminal OutC can be selected for connecting to the second stage input terminals INS1, INS2 of the second stage circuit. In other words, any two of the second output terminal OutA, the fourth output terminal OutB and the sixth output terminal OutC can be selected for connecting to the second stage input terminals INS1, INS2. It is worth mentioning that, in other embodiments, the first output terminal OutAB, the third output terminal OutBB, and the fifth output terminal OutCB may also be connected to the second stage circuit. An artisan of ordinary skill in the art may select all of the six output terminals or a portion of the six output terminals to connect to the second stage circuit.

Figure 3A:
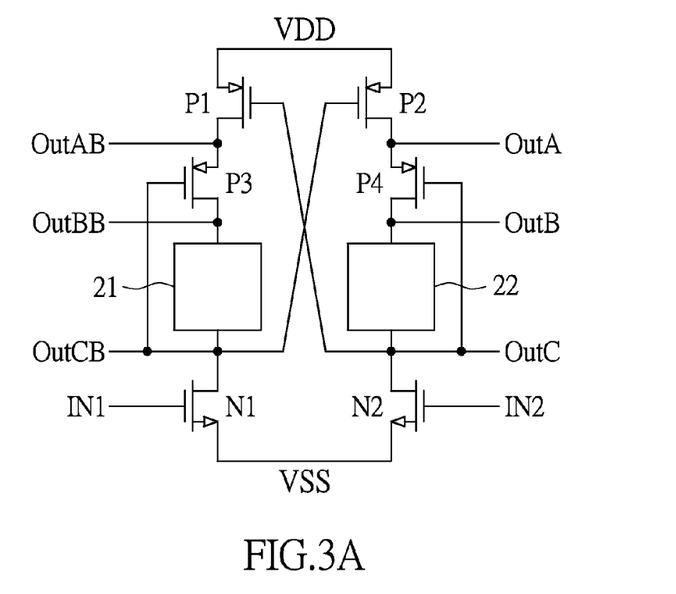
FIG. 3A shows a circuit diagram of a current-limited level shift circuit according to an embodiment of the instant disclosure.
Figure 3B:
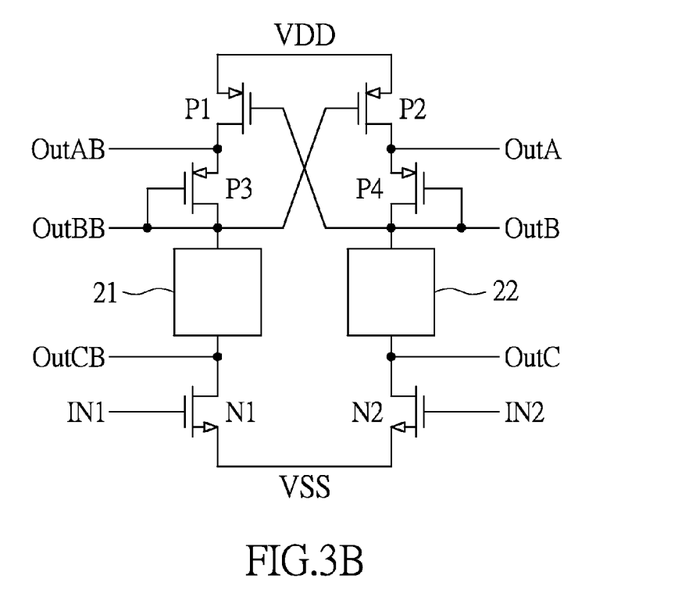
FIG. 3B shows a circuit diagram of a current-limited level shift circuit according to another embodiment of the instant disclosure.
Figure 3C:
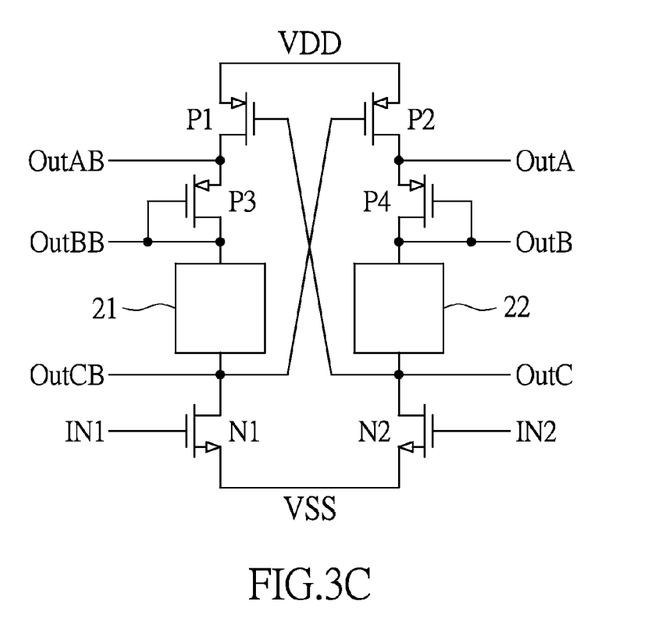
FIG. 3C shows a circuit diagram of a current-limited level shift circuit according to another embodiment of the instant disclosure.
Figure 3D:
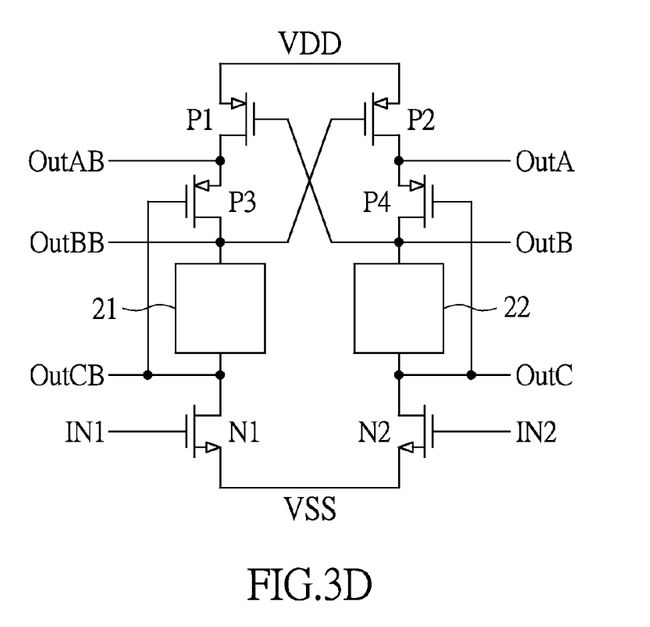
FIG. 3D shows a circuit diagram of a current-limited level shift circuit according to another embodiment of the instant disclosure.

Please refer to FIG. 3A in conjunction with FIG. 3B, FIG. 3C, and FIG. 3D. The current-limited level shift circuit of this embodiment has four types respectively shown in FIG. 3A, FIG. 3B, FIG. 3C and FIG. 3D, wherein the circuit shown in FIG. 3A is the same as the current-limited level shift circuit 2 shown in FIG. 2. The circuits of FIG. 3B, FIG. 3C and FIG. 3D are only modifying the connections of the gate of the first PMOS transistor P1 and the gate of the second PMOS transistor P2, and the connections of the gate of the third PMOS transistor P3 and the gate of the fourth transistor P4. For the circuit shown in FIG. 3B, the gate of the first PMOS transistor P1 and the gate of the second PMOS transistor P2 are respectively connected to the fourth output terminal OutB and the third output terminal OutBB, and the gate of the third PMOS transistor P3 and the gate of the fourth transistor P4 are respectively connected to the third output terminal OutBB and the fourth output terminal OutB. For the circuit shown in FIG. 3C, the gate of the first PMOS transistor P1 and the gate of the second PMOS transistor P2 are respectively connected to the sixth output terminal OutC and the fifth output terminal OutCB, and the gate of the third PMOS transistor P3 and the gate of the fourth transistor P4 are respectively connected to the third output terminal OutBB and the fourth output terminal OutB. For the circuit shown in FIG. 3D, the gate of the first PMOS transistor P1 and the gate of the second PMOS transistor P2 are respectively connected to the fourth output terminal OutB and the third output terminal OutBB, and the gate of the third PMOS transistor P3 and the gate of the fourth transistor P4 are respectively connected to the fifth output terminal OutCB and the sixth output terminal OutC. In other words, in order to adjust the voltage level of the output terminals, we can choose to connect the gate of the first PMOS transistor P1 and the gate of the second PMOS transistor P2 to the fourth output terminal OutB and the third output terminals OutBB respectively, or connect the gate of the first PMOS transistor P1 and the gate of the second PMOS transistor P2 to the sixth output terminal OutC and the fifth output terminals OutCB respectively. In the same way, in order to adjust the voltage level of the output terminals, we can choose to connect the gate of the third PMOS transistor P3 and the gate of the fourth PMOS transistor P4 to the third output terminal OutBB and the fourth output terminals OutB respectively, or connect the gate of the third PMOS transistor P3 and the gate of the fourth PMOS transistor P4 to the fifth output terminal OutCB and the sixth output terminals OutC respectively. Further, due to the symmetrical architecture of the current-limited level shift circuit of this embodiment, the current-limited level shift circuit of this embodiment has aforementioned four types of implementations.

Figure 4A:
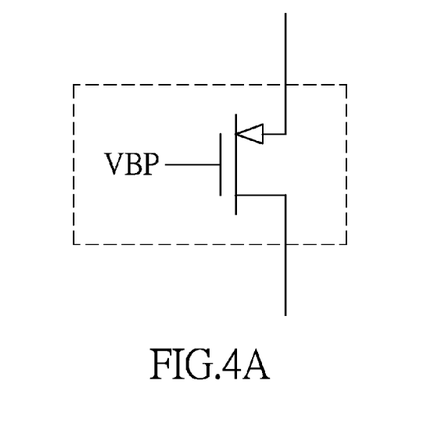
FIG. 4A, FIG. 4B and FIG. 4C respectively show a circuit diagram of a current-limiting unit according to an embodiment of the instant disclosure.
Figure 4B:
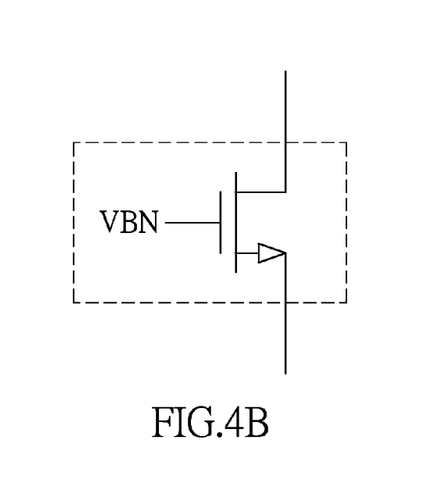
Figure 4C:
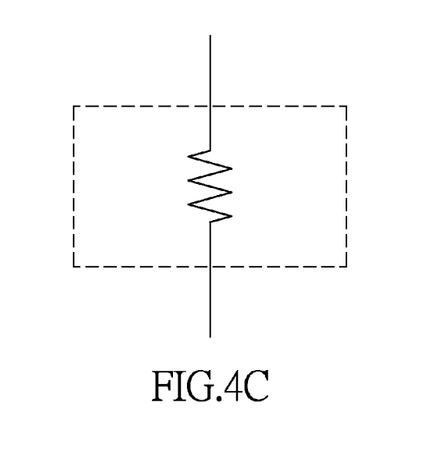

Please refer to FIG. 4A, FIG. 4B and FIG. 4C, the mentioned first current-limiting unit 21 and second current-limiting unit 22 may be the PMOS transistor shown in FIG. 4A, the NMOS transistor shown in FIG. 4B, the resistor shown in FIG. 4C, or a circuit comprising at least one of the PMOS transistor, the NMOS transistor, and the resistor. When the first current-limiting unit 21 and the second current-limiting unit 22 are both the PMOS transistor shown in FIG. 4A, the source of the PMOS transistor being the first current-limiting unit 21 is the first terminal of the first current-limiting unit 21, and the drain of the PMOS transistor being the first current-limiting unit 21 is the second terminal of the first current-limiting unit 21. Similarly, the source of the PMOS transistor being the second current-limiting unit 22 is the first terminal of the second current-limiting unit 22, and the drain of the PMOS transistor being the second current-limiting unit 22 is the second terminal of the second current-limiting unit 22. When the first current-limiting unit 21 and the second current-limiting unit 22 are both the NMOS transistor shown in FIG. 4B, the drain of the NMOS transistor being the first current-limiting unit 21 is the first terminal of the first current-limiting unit 21, and the source of the NMOS transistor being the first current-limiting unit 21 is the second terminal of the first current-limiting unit 21. Similarly, the drain of the NMOS transistor being the second current-limiting unit 22 is the first terminal of the second current-limiting unit 22, and the source of the NMOS transistor being the second current-limiting unit 22 is the second terminal of the second current-limiting unit 22. The gates of the aforementioned PMOS transistor and NMOS transistor respectively receive the current-limiting control signals VBP and VBN, in which the current-limiting control signals VBP and VBN can control the current flowing through the first current-limiting unit 21 and the second current-limiting unit 22. Similarly, when the first current-limiting unit 21 and the second current-limiting unit 22 are both the resistor, the resistors of the first current-limiting unit 21 and the second current-limiting unit 22 are operating as the current limiting resistors.

Figure 5A:
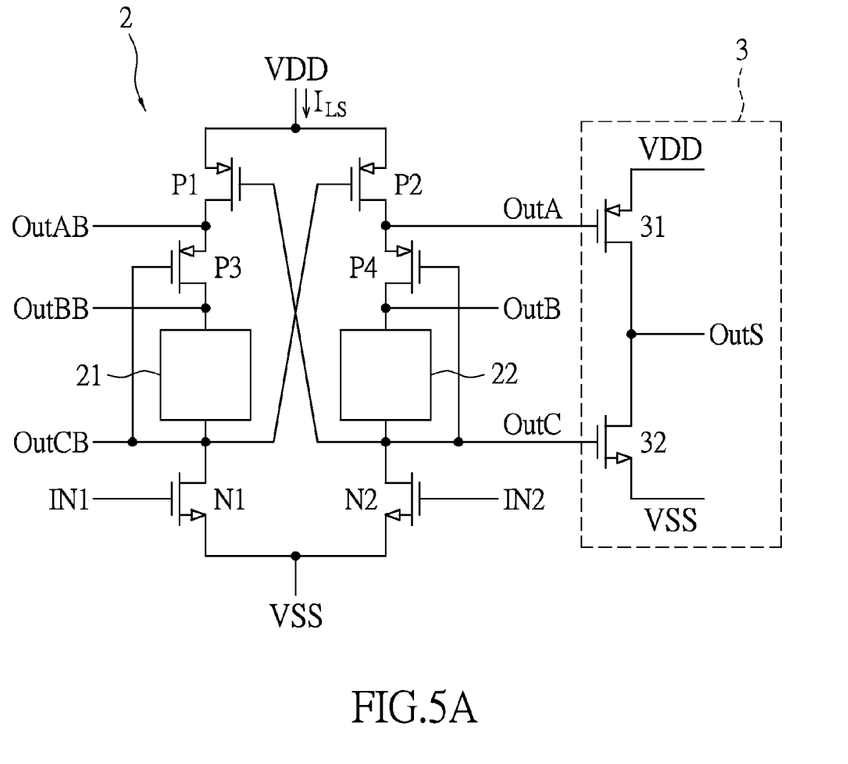
FIG. 5A shows a circuit diagram of a current-limited level shift circuit and the second stage circuit of FIG. 3A.
Figure 5B:
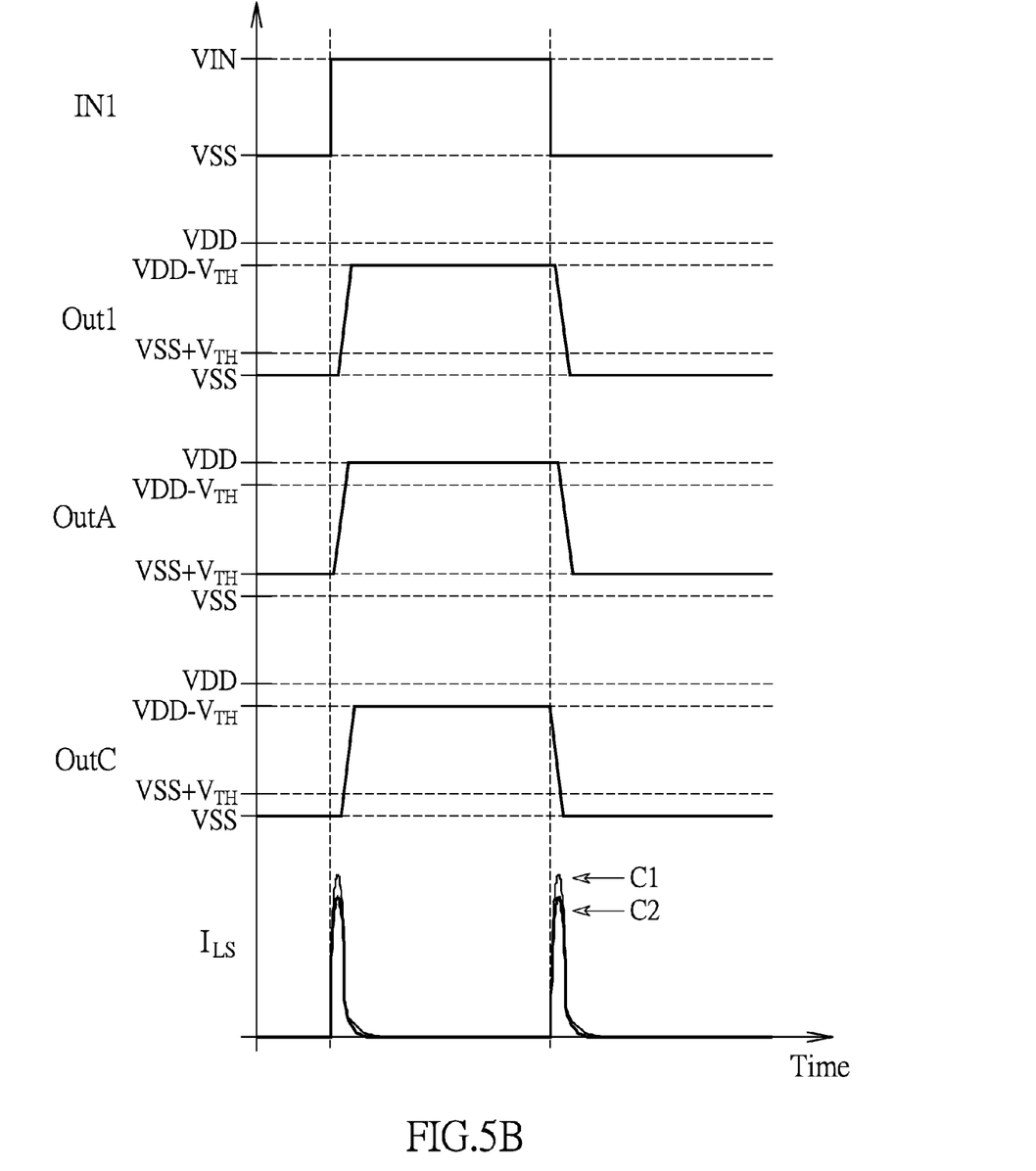
FIG. 5B shows a diagram of the waveforms of the current-limited level shift circuit of FIG. 5A and the conventional level shift circuit of FIG. 1.

Please refer to FIG. 1 in conjunction with FIG. 5A and FIG. 5B, FIG. 5A shows a circuit diagram of a current-limited level shift circuit and the second stage circuit of FIG. 3A, FIG. 5B shows a diagram of the waveforms of the current-limited level shift circuit of FIG. 5A and the conventional level shift circuit of FIG. 1. In FIG. 5A, the second stage circuit 3 comprises the PMOS transistor 31 and the NMOS transistor 32. The source of the PMOS transistor 31 is connected to the first voltage level VDD, the gate of the PMOS transistor 31 is connected to the second output terminal OutA, and the drain of the PMOS transistor 31 is connected to the second stage output terminal OutS. The source of the NMOS transistor 32 is connected to the second voltage level VSS, the gate of the NMOS transistor 32 is connected to the sixth output terminal OutC, and the drain of the NMOS transistor 32 is connected to the second stage output terminal OutS.

In other words, the second stage circuit 3 is significantly identical to the CMOS inverter 110 of FIG. 1, except that a single input terminal of the CMOS inverter 110 is changed to two input terminals of the second stage circuit 3, that is the gate of the PMOS transistor 31 and the gate of the NMOS transistor 32 are respectively connected to the second output terminal OutA and the sixth output terminal OutC. Furthermore, as shown in FIG. 5B, when the output terminal Out1 of the conventional level shift circuit 1 is in a higher voltage level, the voltage level of the output terminal Out1 would be the first voltage level VDD minus the threshold voltage $V_{TH}$ between the gate and the source of the fourth PMOS transistor P4 (that is the voltage across the gate and the source) due the connection between the gate and the source of the fourth PMOS transistor P4. That is, the high voltage level of the output terminal Out1 is VDD–$V_{TH}$, therefore the PMOS transistor of the second stage circuit 110 may not be tightly closed. On the contrary, the circuit of FIG. 5A connects the second output terminal OutA to the gate of the PMOS transistor 31, and the high voltage level of the second output terminal OutA is VDD, thus the PMOS transistor 31 of the second stage circuit 3 can be tightly closed. Meanwhile, as shown in FIG. 5A, the sixth output terminal OutC is selected to connect to the NMOS transistor 32 of the second stage circuit 3, and the low voltage level of the sixth output terminal OutC is the second voltage level VSS, thus the voltage for turning off the NMOS transistor 32 of the second stage circuit 3 of FIG. 5A is the same as the low voltage level of the output terminal Out1 of the conventional level shift circuit 1 of FIG. 1, therefore the operation of the NMOS transistor 32 of the second stage circuit 3 would not be affected. Additionally, for the current $I_{LS}$ shown in FIG. 5B, the current of the state transition of the conventional level shift circuit 1 of FIG. 1 is presented by the waveform C1, the current of the state transition of the current-limited level shift circuit 3 of FIG. 5A is presented by the waveform C2. The peak current of the waveform C2 is less, thus it can be seen that the current consumption of the current-limited level shift circuit 2 of this embodiment is less.

Figure 6:
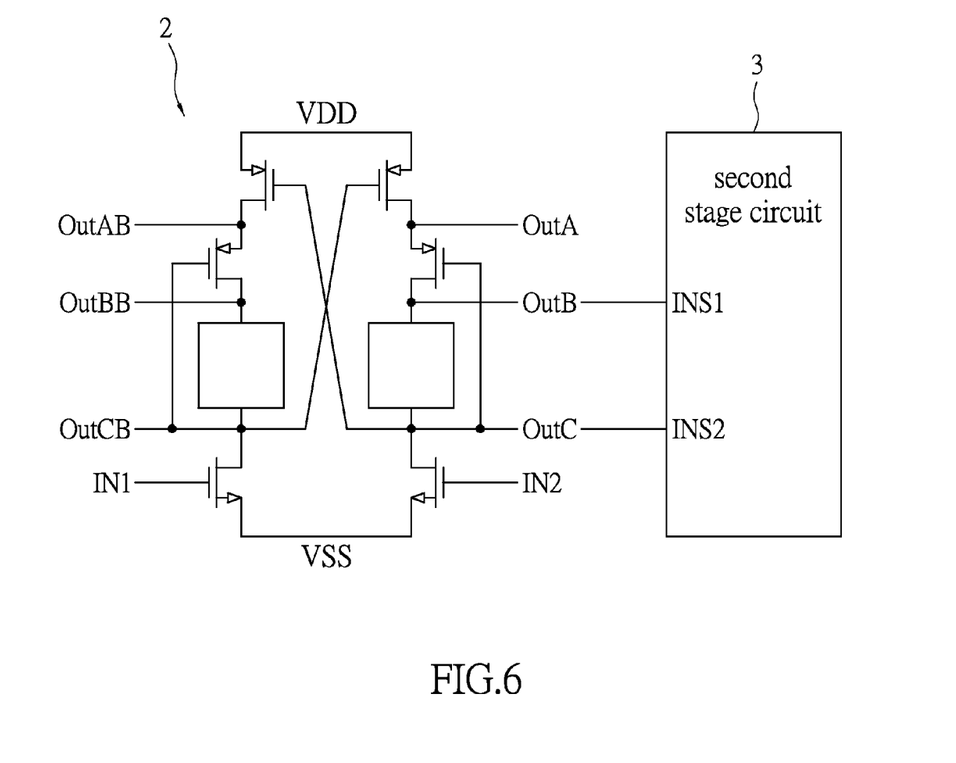
FIG. 6 shows a schematic diagram of a current-limited level shift circuit in connection with the second stage circuit according to another embodiment of the instant disclosure.

Please refer to FIG. 5A in conjunction with FIG. 6, FIG. 6 shows a schematic diagram of a current-limited level shift circuit in connection with the second stage circuit according to another embodiment of the instant disclosure. For the circuit shown in FIG. 6, the fourth output terminal OutB and the sixth output terminal OutC are respectively connected to the input terminals INS1 and INS2 of the second stage circuit 3 of FIG. 5A. That is, instead of connecting the gate of the PMOS transistor 31 of FIG. 5A to the second output terminal OutA, the gate of the PMOS transistor 31 of FIG. 5A is connected to the fourth output terminal OutB.

Figure 7A:
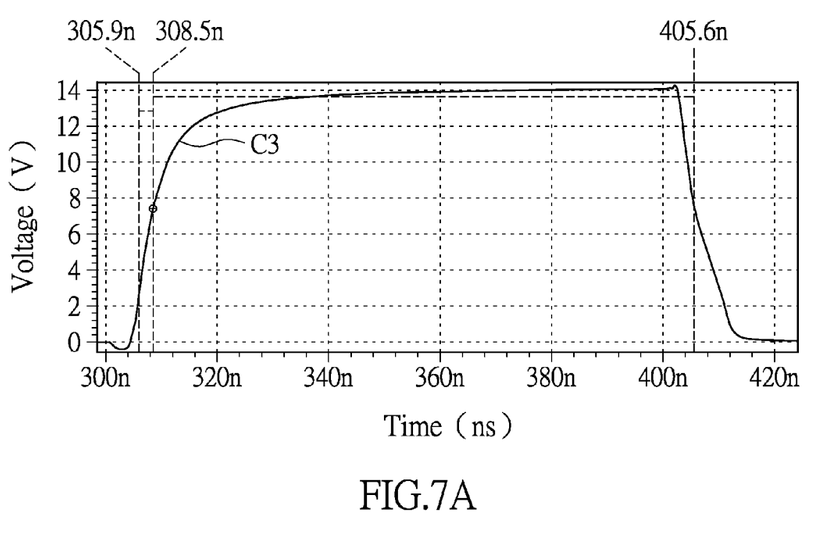
FIG. 7A shows a diagram of the waveforms of the output terminal of the conventional level shift circuit of FIG. 1 during phase transition.
Figure 7B:
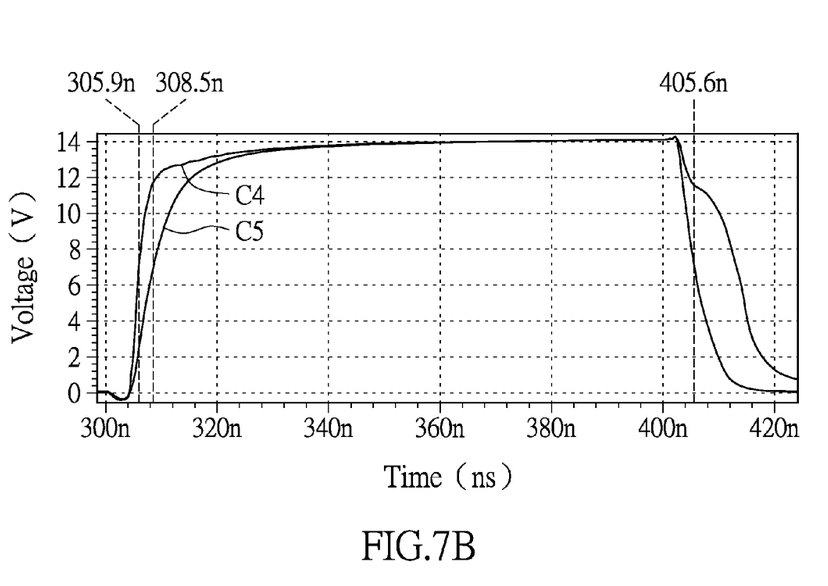
FIG. 7B shows a diagram of the waveforms of the output terminal of the current-limited level shift circuit of FIG. 6 during phase transition.

Please refer to FIG. 7A in conjunction with FIG. 7B, FIG. 7A shows a diagram of the waveforms of the output terminal of the conventional level shift circuit of FIG. 1 during phase transition, FIG. 7B shows a diagram of the waveforms of the output terminal of the current-limited level shift circuit of FIG. 6 during phase transition. The waveform C3 shown in FIG. 7A is the waveform of the output terminal Out1 of the conventional level shift circuit 1 transiting from the low voltage level to the high voltage level. The waveform C4 shown in FIG. 7B is the waveform of the fourth output terminal OutB of the current-limited level shift circuit 2 of FIG. 6 transiting from the low voltage level to the high voltage level. The waveform C5 shown in FIG. 7B is the waveform of the sixth output terminal OutC of the current-limited level shift circuit 2 of FIG. 6 transiting from the low voltage level to the high voltage level. The fourth output terminal OutB of the current-limited level shift circuit 2 can provide faster transition during rising of the voltage (that is at the rising edge), and the sixth output terminal OutC can provide faster transition during falling of the voltage (that is at the falling edge). It can be seen, in order to providing faster transition speed, an artisan of ordinary skill in the art can select the proper output terminal(s) for connecting to the second stage circuit, and the current-limited level shift circuit of this embodiment could be used in a wider range of applications accordingly.

According to above descriptions, the provided current-limited level shift circuit provides level shift signal with one pair of input terminals and three pairs of output terminals. The first current-limiting unit of the provided current-limited level shift circuit is connected between the third output terminal and the fifth output terminal, and the second current-limiting unit of the provided current-limited level shift circuit is connected between the fourth output terminal and the sixth output terminal, thus the provided current-limited level shift circuit could provide current limiting during the state transition. Accordingly, the current consumption of the state transition can be reduced, for improving the conversion efficiency. Additionally, multiple pairs of output terminals or multiple output terminals of the provided current-limited level shift circuit provide a plurality of input selections for the second stage circuit. Accordingly, when the second stage circuit is a logic circuit, the user can select proper output terminal(s) among the plurality of output terminals to obtain a faster transition speed, or reduce the static current leakage of the second stage circuit.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A current-limited level shift circuit, comprising:
   a first PMOS transistor, a source of the first PMOS transistor connected to a first voltage level, a drain of the first PMOS transistor connected to a first output terminal;
   a second PMOS transistor, a source of the second PMOS transistor connected to the first voltage level, a drain of the second PMOS transistor connected to a second output terminal, wherein the first output terminal and the second output terminal are in pairs;
   a third PMOS transistor, a source of the third PMOS transistor connected to the drain of the first PMOS transistor, a drain of the third PMOS transistor connected to a third output terminal;
   a fourth PMOS transistor, a source of the fourth PMOS transistor connected to the drain of the second PMOS transistor, a drain of the fourth PMOS transistor connected to a fourth output terminal, wherein the third output terminal and the fourth output terminal are in pairs;
   a first current-limiting unit, a first terminal of the first current-limiting unit connected to the drain of the third PMOS transistor;
   a second current-limiting unit, a first terminal of the second current-limiting unit connected to the drain of the fourth PMOS transistor;
   a first NMOS transistor, a source of the first NMOS transistor connected to a second voltage level, a gate of the first NMOS transistor connected to a first input terminal, a drain of the first NMOS transistor connected to a fifth output terminal and a second terminal of the first current-limiting unit; and
   a second NMOS transistor, a source of the second NMOS transistor connected to the second voltage level, a gate of the second NMOS transistor connected to a second input terminal, a drain of the second NMOS transistor connected to a sixth output terminal and a second terminal of the second current-limiting unit, wherein the fifth output terminal and the sixth output terminal are in pairs;
   wherein a gate of the first PMOS transistor and a gate of the second PMOS transistor are respectively connected to the pair of the fourth output terminal and the third output terminal or the pair of the sixth output terminal and the fifth output terminal, a gate of the third PMOS transistor and a gate of the fourth PMOS transistor are respectively connected to the pair of the third output terminal and the fourth output terminal or the pair of the fifth output terminal and the sixth output terminal;
   wherein the pair of the first output terminal and the second output terminal, the pair of the third output terminal and the fourth terminal, and the pair of the fifth output terminal and the sixth output terminal are for selectively connecting to a second stage circuit.

2. The current-limited level shift circuit according to claim 1, wherein the first input terminal is for inputting a first input signal, the second input terminal is for inputting a second input signal, and the second input signal is the inverted signal of the first input signal.

3. The current-limited level shift circuit according to claim 1, wherein the first current-limiting unit is a PMOS transistor, a NMOS transistor, a resistor, or a circuit comprising at least one of the PMOS transistor, the NMOS transistor, and the resistor.

4. The current-limited level shift circuit according to claim 1, wherein the second current-limiting unit is a PMOS transistor, a NMOS transistor, a resistor, or a circuit comprising at least one of the PMOS transistor, the NMOS transistor, and the resistor.

5. The current-limited level shift circuit according to claim 1, wherein the first current-limiting unit is a fifth PMOS transistor, a source of the fifth PMOS transistor is the first terminal of the first current-limiting unit, a drain of the fifth PMOS transistor is the second terminal of the first current-limiting unit, the second current-limiting unit is a sixth PMOS transistor, a source of the sixth PMOS transistor is the first terminal of the second current-limiting unit, a drain of the sixth PMOS transistor is the second terminal of the second current-limiting unit.

6. The current-limited level shift circuit according to claim 1, wherein the first current-limiting unit is a third NMOS transistor, a drain of the third NMOS transistor is the first terminal of the first current-limiting unit, a source of the third NMOS transistor is the second terminal of the first current-limiting unit, the second current-limiting unit is a fourth NMOS transistor, a drain of the fourth NMOS transistor is the first terminal of the second current-limiting unit, a source of the fourth NMOS transistor is the second terminal of the second current-limiting unit.

7. The current-limited level shift circuit according to claim 1, wherein the second stage circuit is a logic circuit or a digital circuit.

8. The current-limited level shift circuit according to claim 1, wherein the second stage circuit is an operational amplifier, a comparator, an inverter or a level shift circuit.

9. The current-limited level shift circuit according to claim 2, wherein the first input signal has a third voltage level and a second voltage level, the second input signal is the inverted signal of the first input signal, wherein the third voltage level is lower than the first voltage level, and the second voltage level is lower than the third voltage level.

* * * * *